US010867968B2

(12) United States Patent
Chen et al.

(10) Patent No.: US 10,867,968 B2
(45) Date of Patent: Dec. 15, 2020

(54) 3DIC STRUCTURE WITH PROTECTIVE STRUCTURE AND METHOD OF FABRICATING THE SAME

(71) Applicant: Taiwan Semiconductor Manufacturing Co., Ltd., Hsinchu (TW)

(72) Inventors: Hsien-Wei Chen, Hsinchu (TW); Ching-Jung Yang, Taoyuan (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/699,098

(22) Filed: Nov. 28, 2019

(65) Prior Publication Data

US 2020/0098731 A1    Mar. 26, 2020

Related U.S. Application Data (63) Continuation of application No. 16/016,670, filed on Jun. 25, 2018, now Pat. No. 10,504,873.

(51) Int. Cl.
| | |
|---|---|
| *H01L 29/10* | (2006.01) |
| *H01L 29/76* | (2006.01) |
| *H01L 31/036* | (2006.01) |
| *H01L 31/112* | (2006.01) |
| *H01L 25/065* | (2006.01) |
| *H01L 21/768* | (2006.01) |
| *H01L 21/56* | (2006.01) |

(Continued)

(52) U.S. Cl.
CPC .......... *H01L 25/0657* (2013.01); *H01L 21/56* (2013.01); *H01L 21/7684* (2013.01); *H01L 21/76879* (2013.01); *H01L 21/76898* (2013.01); *H01L 23/481* (2013.01); *H01L 23/528* (2013.01); *H01L 23/5226* (2013.01); *H01L 24/09* (2013.01); *H01L 25/50* (2013.01); *H01L 2224/0236* (2013.01); *H01L 2224/02372* (2013.01); *H01L 2224/05025* (2013.01); *H01L 2224/08235* (2013.01)

(58) Field of Classification Search
CPC . H01L 25/0657; H01L 24/09; H01L 23/5226; H01L 23/481; H01L 23/528; H01L 21/56; H01L 21/76898; H01L 21/76879; H01L 21/7684; H01L 25/50; H01L 2224/0236; H01L 2224/02372; H01L 2224/05025; H01L 2224/08235
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| (Continued) | | | |

*Primary Examiner* — Ismail A Muse
(74) *Attorney, Agent, or Firm* — JCIPRNET (57) ABSTRACT

Provided is a three-dimensional integrated circuit (3DIC) structure including a die stack structure, a metal circuit structure, and a protective structure. The die stack structure includes a first die and a second die face-to-face bonded together. The second die includes a plurality of through-substrate vias (TSVs). The metal circuit structure is disposed over a back side of the second die. The protective structure is sandwiched between and in contact with a bottom surface of the metal circuit structure and a top surface of one of the plurality of TSVs of the second die.

20 Claims, 8 Drawing Sheets

(51) Int. Cl.

| | |
|---|---|
| *H01L 23/528* | (2006.01) |
| *H01L 25/00* | (2006.01) |
| *H01L 23/48* | (2006.01) |
| *H01L 23/522* | (2006.01) |
| *H01L 23/00* | (2006.01) |

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2014/0319678 A1* | 10/2014 | Pagaila ............... H01L 23/3128 257/737 |
| 2015/0187648 A1* | 7/2015 | Lee ................... H01L 21/76831 438/667 |
| 2015/0243848 A1* | 8/2015 | Huang ................ H01L 33/382 257/99 |
| 2016/0111352 A1* | 4/2016 | Couture ............ H01L 21/76834 257/774 |
| 2017/0148729 A1* | 5/2017 | Edelstein .......... H01L 23/53295 |
| 2017/0148740 A1* | 5/2017 | Edelstein ............. H01L 23/528 |

* cited by examiner

3DIC STRUCTURE WITH PROTECTIVE STRUCTURE AND METHOD OF FABRICATING THE SAME

CROSS-REFERENCE TO RELATED APPLICATION

This application is a continuation application of and claims the priority benefit of a prior application Ser. No. 16/016,670, filed on Jun. 25, 2018, now allowed. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Some types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are cross-sectional views of a method of forming a 3DIC structure in accordance with a first embodiment.

Figure 1A:
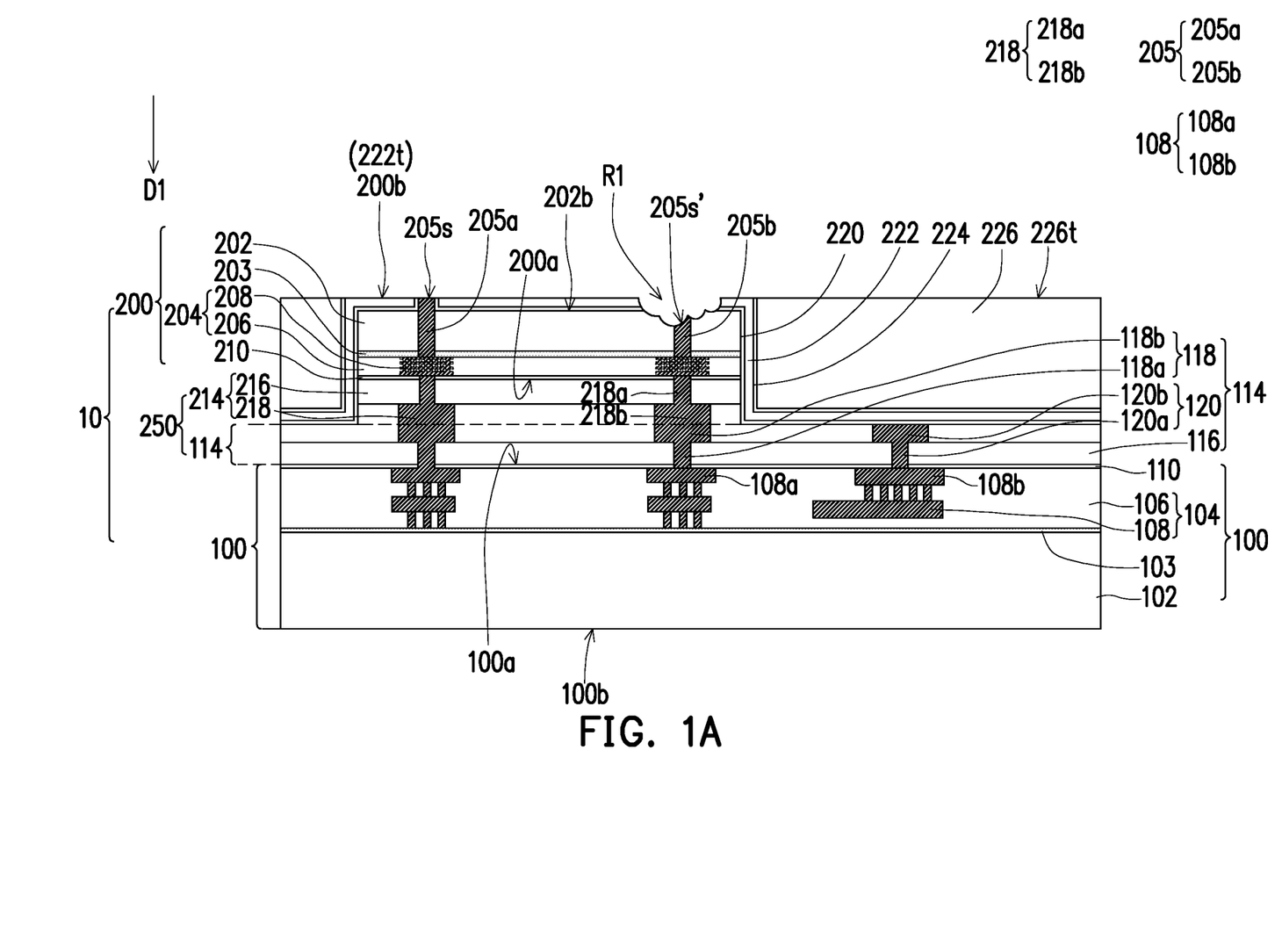
FIG. 1A to FIG. 1E are cross-sectional views of a method of forming a three-dimensional integrated circuit (3DIC) structure in accordance with a first embodiment.

Referring to FIG. 1A, a die stack structure 10 is formed. Specifically, the die stack structure 10 includes a first die 100, a second die 200, and a hybrid bonding structure 250. The first die 100 and the second die 200 are hybrid bonded together by the hybrid bonding structure 250. The die stack structure 10 is formed as following steps, for example.

As shown in FIG. 1A, provided is the first die 100 including a first semiconductor substrate 102, a first device layer 103, a first interconnect structure 104, and a first passivation layer 110.

In some embodiments, the semiconductor substrate 102 may include silicon or other semiconductor materials. Alternatively, or additionally, the first semiconductor substrate 102 may include other elementary semiconductor materials such as germanium. In some embodiments, the first semiconductor substrate 102 is made of a compound semiconductor such as silicon carbide, gallium arsenic, indium arsenide or indium phosphide. In some embodiments, the first semiconductor substrate 102 is made of an alloy semiconductor such as silicon germanium, silicon germanium carbide, gallium arsenic phosphide, or gallium indium phosphide. In some embodiments, the first semiconductor substrate 102 includes an epitaxial layer. For example, the first semiconductor substrate 102 has an epitaxial layer overlying a bulk semiconductor.

In some embodiments, the first device layer 103 is formed over the first semiconductor substrate 102 in a front-end-of-line (FEOL) process. The first device layer 103 includes a wide variety of devices. In some embodiments, the devices comprise active components, passive components, or a combination thereof. In some embodiments, the devices may include integrated circuits devices. The devices are, for example, transistors, capacitors, resistors, diodes, photodiodes, fuse devices, or other similar devices. In some embodiments, the first device layer 103 includes a gate structure, source and drain regions, and isolation structures, such as shallow trench isolation (STI) structures (not shown). In the first device layer 103, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the first semiconductor substrate 102. The functions of the devices may include memory, processors, sensors, amplifiers, power distribution, input/output circuitry, or the like.

Referring to FIG. 1A, the first interconnect structure 104 is formed over the first device layer 103. In detail, the first interconnect structure 104 includes a first insulating material 106 and a plurality of first metal features 108. The first metal features 108 are formed in the first insulating material 106 and electrically connected to the first device layer 103. A portion of the first metal features 108, such as top metal features 108a and 108b, is exposed by the first insulating material 106. In some embodiments, the first insulating material 106 includes an inner-layer dielectric (ILD) layer on the first device layer 103, and at least one inter-metal dielectric (IMD) layer over the ILD layer. In some embodiments, the first insulating material 106 includes silicon oxide, silicon oxynitride, silicon nitride, low dielectric constant (low-k) materials or a combination thereof. In some alternatively embodiments, the first insulating material 106 may be a single layer or multiple layers. In some embodiments, the first metal features 108 include plugs and metal lines. The plugs may include contacts formed in the ILD layer, and vias formed in the IMD layer. The contacts are formed between and in connection with the first device layer 103 and a bottom metal line. The vias are formed between and in connection with two metal lines. The first metal features 108 may be made of tungsten (W), copper (Cu), copper alloys, aluminum (Al), aluminum alloys, or a combination thereof. In some alternatively embodiments, a barrier layer (not shown) may be formed between the first metal features 108 and the first insulating material 106 to prevent the material of the first metal features 108 from migrating to or diffusion to the first device layer 103. A material of the barrier layer includes tantalum, tantalum nitride, titanium, titanium nitride, cobalt-tungsten (CoW) or a combination thereof, for example.

Referring to FIG. 1A, the first passivation layer 110 is formed over the first interconnect structure 104. The first passivation layer 110 covers the first insulating material 106 and portions of the top metal features 108a and 108b. In some embodiments, the first passivation layer 110 includes silicon oxide, silicon nitride, benzocyclobutene (BCB) polymer, polyimide (PI), polybenzoxazole (PBO) or a combination thereof and is formed by a suitable process such as spin coating, CVD or the like. After the first passivation layer 110 is formed over the first interconnect structure 104, the first die 100 is accomplished. As shown in FIG. 1A, the first die 100 has a front side 100a and a back side 100b opposite to each other. Herein, the front side 100a of the first die 100 is faced up, while the back side 100b of the first die 100 is faced down. In some embodiments, the front side 100a of the first die 100 is referred as an active surface.

Referring to FIG. 1A, a first bonding structure 114 is formed over the front side 100a of the first die 100. In detail, the first bonding structure 114 includes a first bonding dielectric layer 116 and a plurality of first bonding metal layers 118 and 120. In some embodiments, the first bonding metal layers 118 and 120 are formed in the first bonding dielectric layer 116. The first bonding metal layer 118 includes a via plug 118a and a metal feature 118b disposed over the via plug 118a, while the first bonding metal layer 120 includes a via plug 120a and a metal feature 120b disposed over the via plug 120a. As shown in FIG. 1A, the via plug 118a penetrates through the first passivation layer 110 and is in connection with the first metal features 108a, while the via plug 120a penetrates through the first passivation layer 110 and is in connection with the first metal features 108b.

In some embodiments, the first bonding metal layers 118 and 120 may include copper, copper alloys, nickel, aluminum, tungsten, a combination of thereof. In some embodiments, the first bonding metal layers 118 and 120 are formed at the same time with the same material. In some other embodiments, the first bonding metal layers 118 and 120 are successively formed with different materials. The first bonding metal layers 118 and 120 may be formed by depositing a conductive material in trenches and via holes (not shown) in the first bonding dielectric layer 116 and then removing the conductive material over a top surface of the first bonding dielectric layer 116 by a planarization process such as a CMP process. After the planarization process, the top surface of the first bonding dielectric layer 116, the top surfaces of the first bonding metal layers 118 and 120 are substantially coplanar.

Referring to FIG. 1A, the second die 200 is similar to the second die 100. That is, the second die 200 includes a second semiconductor substrate 202, a second device layer 203, a second interconnect structure 204, and a second passivation layer 210. The arrangement, material and forming method of the second die 200 are similar to the arrangement, material and forming method of the first die 100. Thus, details thereof are omitted here. In some embodiments, the size of the second die 200 is less than the size of the first die 100. Herein, the term "size" is referred to the length, width, or area. For example, as shown in FIG. 1A, the length of the second die 200 is less than the length of the first die 100.

In some embodiments, one of the first die 100 and the second die 200 may be an application-specific integrated circuit (ASIC) chip, an analog chip, a sensor chip, a wireless and radio frequency chip, a voltage regulator chip or a memory chips, for example. In some alternative embodiments, the first die 100 and the second die 200 may include the same function or different functions. The die stack structure 10 illustrated in FIG. 1A is a chip-on-wafer (CoW) structure. For example, the second die 200 may be a die, the first die 100 may be a wafer, and the die 200 is disposed over the wafer 100. However, the embodiments of the present invention are not limited thereto. In other embodiments, the die stack structure 10 includes a chip-on-chip structure, a die-on-die structure or a combination thereof.

Referring to FIG. 1A, a second bonding structure 214 is formed over a front side 200a of the second die 200. In detail, the second bonding structure 214 includes a second bonding dielectric layer 216 and a second bonding metal layer 218. In some embodiments, the second bonding metal layer 218 is formed in the second bonding dielectric layer 216. The second bonding metal layer 218 includes a via plug 218a and a metal feature 218b. As shown in FIG. 1A, the via plug 218a penetrates through the second passivation layer 210 and is in connection with the second metal features 208 of the second interconnect structure 204. The metal feature 218b is electrically connected to the second metal features 208 through the via plug 218a.

In some embodiments, the second bonding metal layer 218 may include copper, copper alloys, nickel, aluminum, tungsten, a combination of thereof. The second bonding metal layer 218 may be formed by depositing a conductive material in trenches and via holes (not shown) in the second bonding dielectric layer 216 and then removing the conductive material over a top surface of the second bonding dielectric layer 216 by a planarization process such as a CMP process. After the planarization process, the top surface of the second bonding dielectric layer 216 and the top surface of the second bonding metal layer 218 are substantially coplanar.

Referring to FIG. 1A, the second die 200 is further turned upside down and mounted onto the first die 100. In detail, the first die 100 and the second die 200 are face-to-face bonded together via the first bonding structure 114 and the second bonding structure 214. In some embodiments, before the second die 200 is bonded to the first die 100, the first bonding structure 114 and the second bonding structure 214 are aligned, such that the second bonding metal layer 218 may be bonded to the first bonding metal layer 118, and the first bonding dielectric layer 116 may be bonded to the second bonding dielectric layer 216. In some embodiments, the alignment of the first bonding structure 114 and the second bonding structure 214 may be achieved by using an optical sensing method. After the alignment is achieved, the first bonding structure 114 and the second bonding structure 214 are bonded together by a hybrid bonding to form a hybrid bonding structure 250.

The first bonding structure 114 and the second bonding structure 214 are hybrid bonded together by the application of pressure and heat. It is noted that the hybrid bonding involves at least two types of bonding, including metal-to-metal bonding and non-metal-to-non-metal bonding such as dielectric-to-dielectric bonding or fusion bonding. As shown in FIG. 1A, the hybrid bonding structure 250 includes the first bonding metal layer 118 and the second bonding metal layer 218 bonded by metal-to-metal bonding, and the first bonding dielectric layer 116 and the second bonding dielectric layer 216 bonded by non-metal-to-non-metal bonding. However, the embodiments of the present invention are not limited thereto. In other embodiments, the first bonding structure 114 and the second bonding structure 214 may be bonded together by other bonding, such as fusion bonding.

In addition, as shown in FIG. 1A, the second die 200 further includes a plurality of through-substrate vias (TSVs) 205. In some embodiments, the TSVs 205 are formed in the second semiconductor substrate 202 to be electrically connected to the second interconnect structure 204. In some embodiments, one of the TSVs 205 includes a conductive via and a liner (not shown) surrounding the sidewalls and bottom surface of the conductive via. The conductive via may include copper, copper alloys, aluminum, aluminum alloys, Ta, TaN, Ti, TiN, CoW or combinations thereof. The liner may include dielectric material, such as silicon oxide. In some embodiments, the TSVs 205 do not penetrate through the second semiconductor substrate 202 at the beginning, and the bottom surfaces of the TSVs 205 are still covered by the second semiconductor substrate 202. In subsequent processes, a thinning process is performed on the back surface 202b of the second semiconductor substrate 202, so as to expose the top surfaces 205s of the TSVs 205, and the TSVs 205 may be connected to other components. In some embodiments, the thinning process may include a grinding process or a chemical mechanical polishing (CMP) process.

Figure 1B:
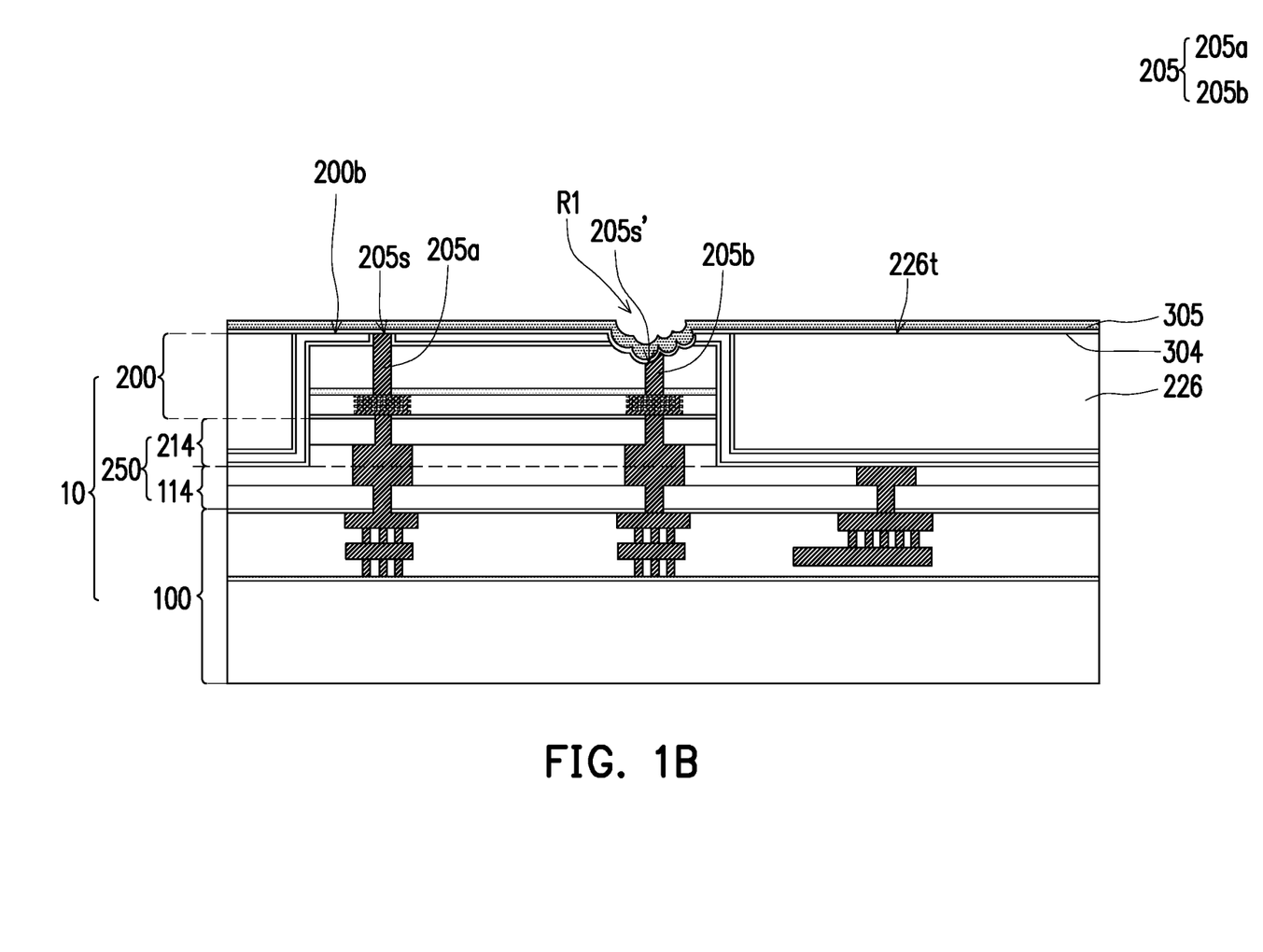
Figure 1C:
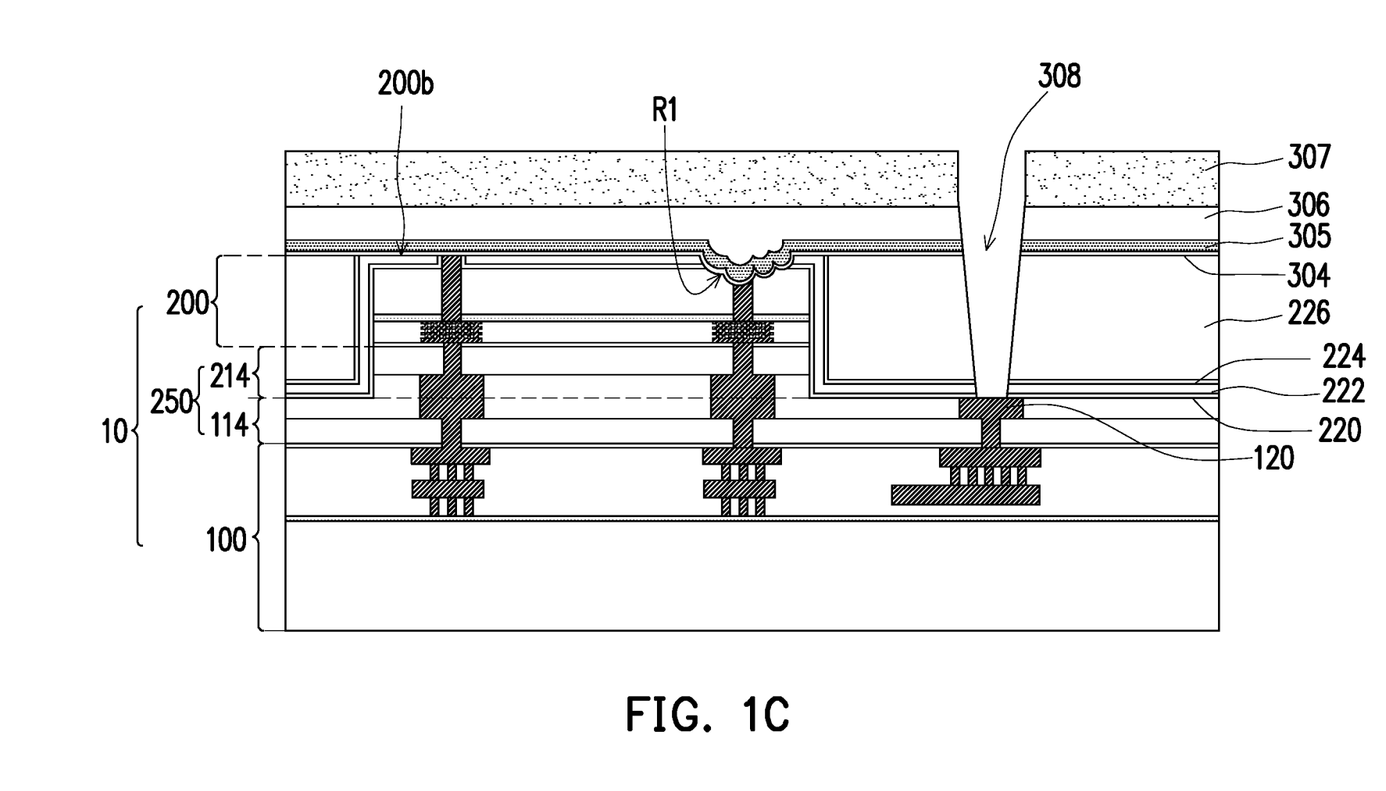
Figure 1D:
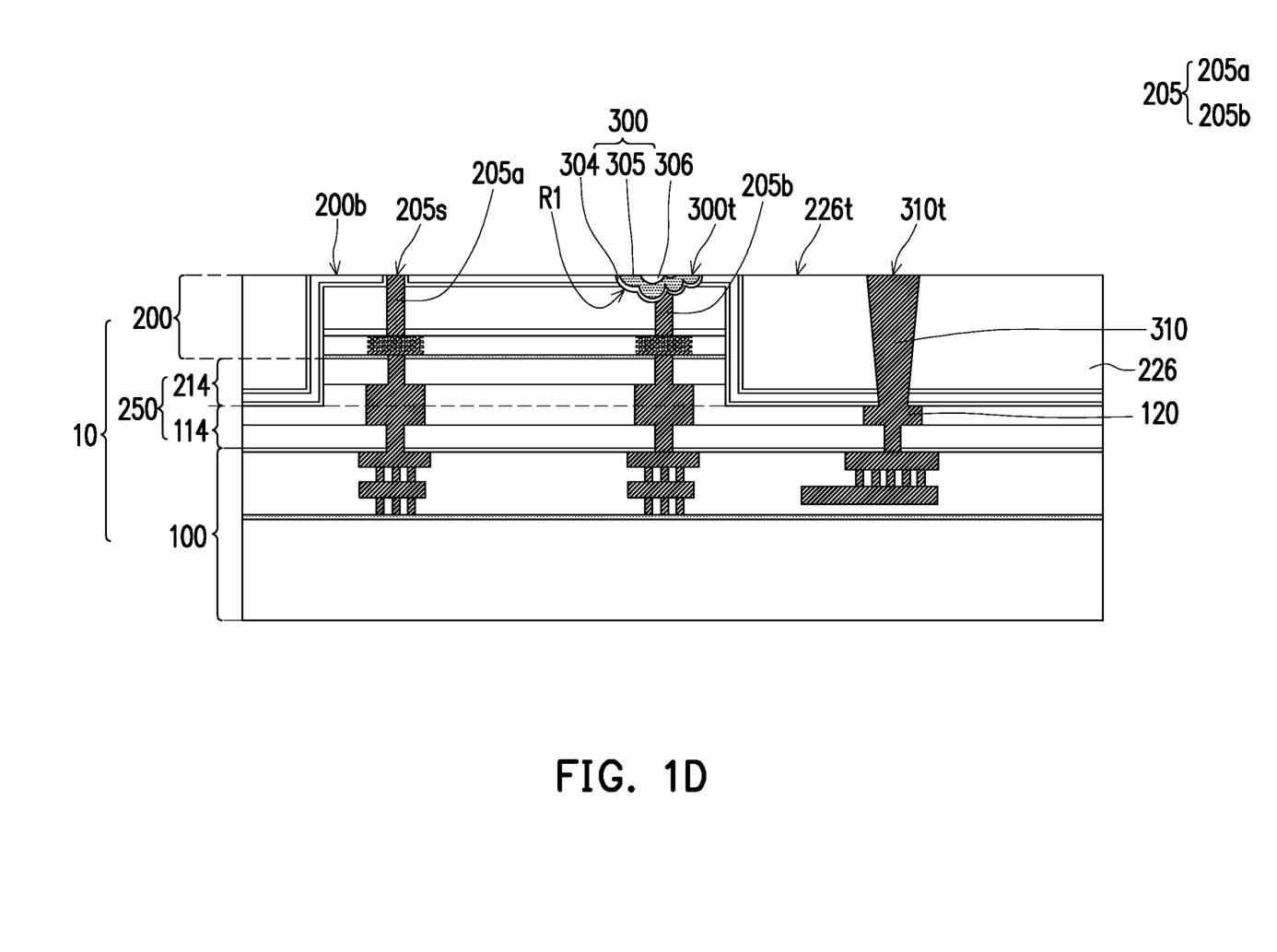
Figure 1E:
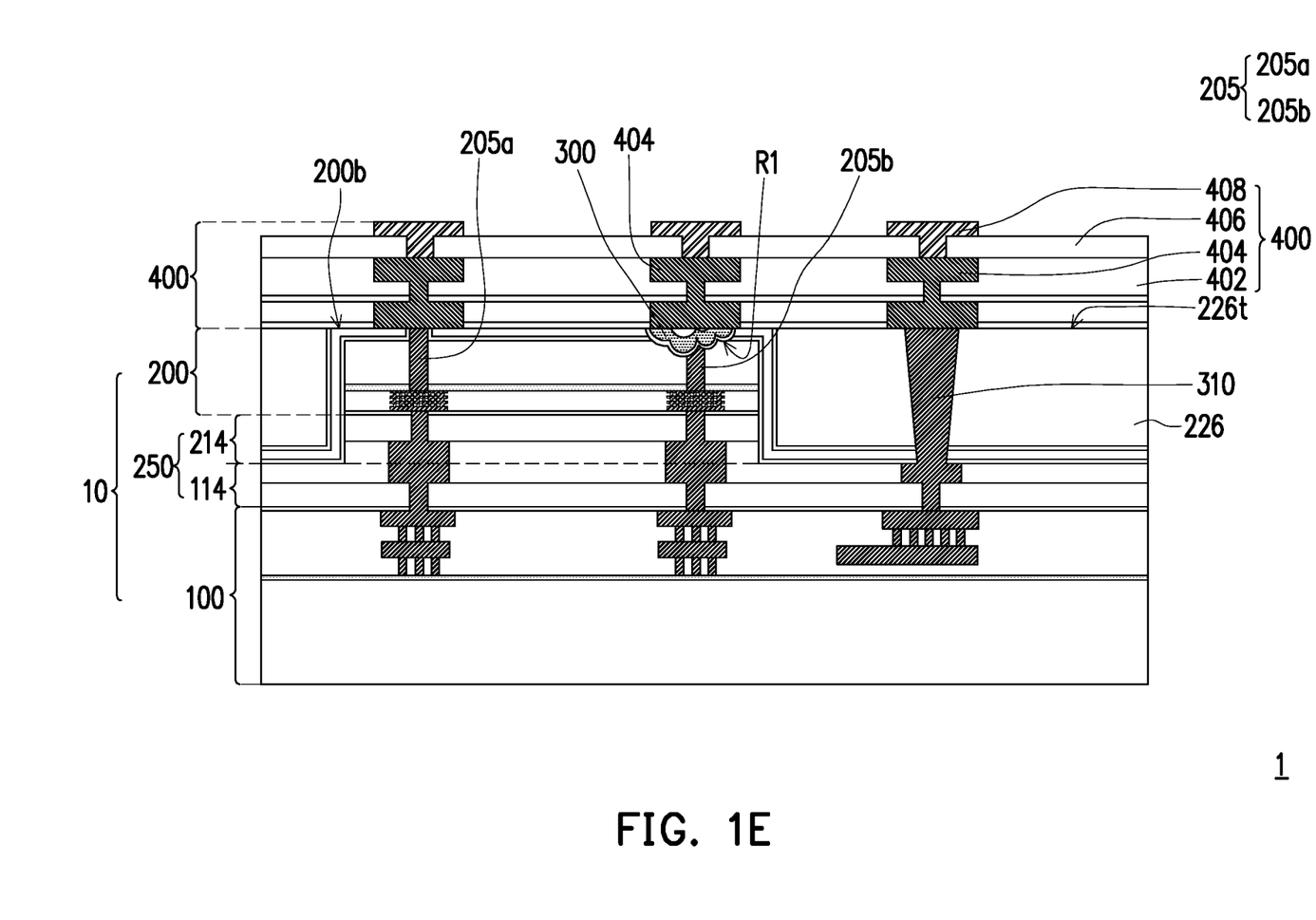

After performing the thinning process, the back surface 202b of the second semiconductor substrate 202 is lower than the top surfaces 205s of the TSVs 205 to make sure the TSVs 205 being able to be connected to the to-be-formed metal circuit structure 400 (as shown in FIG. 1E). After the top surfaces 205s of the TSVs 205 are exposed, a nitride layer 220 (e.g., silicon nitride layer) is formed over the second die 200. The nitride layer 220 conformally covers the surfaces of the TSVs 205 exposed by the second semiconductor substrate 202, the back surface 202b of the second semiconductor substrate 202, sidewalls of the second die 200, and the top surface of the first bonding structure 114 not bonded to the second bonding structure 214. An oxide layer 222 (e.g., silicon oxide layer) is conformally formed over the nitride layer 220. A nitride layer 224 (e.g., silicon nitride layer) is conformally formed over the oxide layer 222. A dielectric layer 226 (e.g., gap-fill dielectric layer) is formed over the first die 100 and encapsulates the second die 200. That is, the dielectric layer 226 covers the sidewalls of the second die 200 and the bottom surface 202a of the second semiconductor substrate 202. In some embodiments, the dielectric layer 226 may include oxide such as silicon oxide, nitride such as silicon nitride, oxynitride such as silicon oxynitride, a molding compound, a molding underfill, a resin such as epoxy, a combination thereof, or the like.

A planarization process (or referred as a first planarization process) is then performed. In some embodiments, the planarization process is a CMP process. After performing the planarization process, the excess dielectric layer 226, the excess nitride layer 224, the excess oxide layer 222, and the excess nitride layer 220 are removed, so that the top surfaces 205s of the TSVs 205 and the top surface 222t of the remaining oxide layer 222 are exposed, as shown in FIG. 1A. The remaining oxide layer 222 laterally encapsulates a portion of the TSVs 205. The remaining dielectric layer 226 also laterally encapsulates the second die 200 to separate from other die (not shown) bonded over the first die 100. After performing the planarization process, the die stack structure 10 is accomplished. In the case, the top surface 222t of the remaining oxide layer 222 may be referred as the back side 200b of the second die 200. The back side 200b of the second die 200, the top surfaces 205s of the TSVs 205, and the top surface 226t of the remaining dielectric layer 226 are at substantially the same level after performing the planarization process. Herein, when elements are described as "at substantially the same level", the elements are formed at substantially the same height in the same layer, or having the same positions embedded by the same layer. In some embodiments, the elements at substantially the same level are formed from the same material(s) with the same process step(s). In some embodiments, the tops of the elements at substantially the same level are substantially coplanar. For example, as shown in FIG. 1A, the back side 200b of the second die 200, the top surfaces 205s of the TSVs 205, and the top surface 226t of the remaining dielectric layer 226 are substantially coplanar.

It should be noted that a recess R1 is formed in the back side 200b of the second die 200 after performing the planarization process (or referred as the first planarization process) or the thinning process. The recess R1 may be various defects, such as cracks, sharp morphology, bulge, etc. The recess R1 is formed because some undesired particles may be dropped on the to-be-ground surface, the planarization process or the thinning process is then performed to damage the back side 200b of the second die 200. As shown in FIG. 1A, the recess R1 extends along a direction D1 from the back side 200b of the second die 200 toward the hybrid bonding structure 250. The recess R1 recesses the TSV 205b of the second die 200, so that the top surface 205s' of the TSV 205b is lower than the top surface 205s of the TSV 205a. In addition, the top surface 205s' of the TSV 205b has an uneven surface or sharp morphology. By contrast, the top surface 205s of the TSV 205a without suffering the defects' damage has a smooth surface or a flat surface.

Referring to FIG. 1B, a conformal layer 305 is formed over the die stack structure 10 after performing the planarization process. The conformal layer 305 conformally covers the back side 200b of the second die 200, the top surfaces 205s of the TSVs 205, and the top surface 226t of the remaining dielectric layer 226. Further, the conformal layer 305 also conformally and completely covers the surface of the recess R1 (or the top surface 205s' of the TSV 205b) to prevent from the plasma etching arcing during the following patterning. In some embodiments, the conformal layer 305 is formed to cover the surface of the recess R1 when the recess R1 is detected. In some alternative embodiments, the conformal layer 305 is still formed to cover the surface of the recess R1 when the recess R1 is too slight to be detected. The conformal layer 305 is formed by an atomic layer deposition (ALD) process, for example. In some embodiments, the conformal layer 305 may include silicon oxide, silicon nitride, silicon oxynitride, or a combination thereof. In alternative embodiments, the conformal layer 305 may be a single layer structure, a bilayer structure, or a multilayer structure. In other embodiments, a thickness of the conformal layer 305 is 500 Å to 3500 Å. Herein, the conformal layer is referred as a layer with a uniform thickness and the layer has a thickness difference less than 50 Å, such as 30 Å~50 Å for example.

In addition, in some embodiments, before the conformal layer 305 is formed, a nitride layer 304 (e.g., silicon nitride layer) is formed on the second die 200. In some embodiments, the nitride layer 304 is formed by a suitable deposition process, such as a CVD process or ALD process and a thickness of the nitride layer 304 is 300 Å to 1000 Å. In alternative embodiments, the thickness of the conformal layer 305 is greater than the thickness of the nitride layer 304. In other embodiments, the nitride layer 304 and the conformal layer 305 include the same material or different materials.

Referring to FIG. 1C, a CVD process is performed to form a filling layer 306 over the conformal layer 305. In some embodiments, the filling layer 306 may include silicon oxide, silicon nitride, silicon oxynitride, or a combination thereof. In other embodiments, a thickness of the filling layer 306 is 5 KÅ to 30 KÅ. Since the conformal layer 305 has a better step coverage than the filling layer 306, the conformal layer 305 is able to fully cover the surface of the recess R1 having sharp morphology. In some embodiments, the conformal layer 305 and the filling layer 306 have the same material or different materials. In some alternative embodiments, the thickness of the filling layer 306 is greater than or equal to the thickness of the conformal layer 305. However, the embodiments of the present invention are not limited thereto.

After forming the filling layer 306, a mask pattern 307 is formed over the filling layer 306. In some embodiments, the mask pattern 307 includes photoresist and is formed by a suitable process, such as a spin coating and a photolithography process. After the mask pattern 307 is formed, an etching process is performed by using the mask pattern 307 as etching mask to remove portions of the filling layer 306, the conformal layer 305, the nitride layer 304, the dielectric layer 226, the nitride layer 224, the oxide layer 222, and the nitride layer 220, so that an opening 308 is formed. As shown in FIG. 1C, the opening 308 exposes the first bonding metal layer 120. After the opening 308 is formed, the mask pattern 307 is removed.

Referring to FIG. 1C and FIG. 1D, a conductive material (not shown) is formed to fill in the opening 308 and extended to cover the filling layer 306. A planarization process (or referred as a second planarization process) is performed to remove portions of the conductive material, the filling layer 306, the conformal layer 305, and the nitride layer 304 and expose the top surfaces 205s of the TSVs 205. After the planarization process is performed, a through dielectric via (TDV) 310 is formed in the dielectric layer 226 and a protective structure 300 is formed in the back side 200b of the second die 200, as shown in FIG. 1D. The TDV 310 is formed in the dielectric layer 226 to electrically connect to the first bonding metal layer 120 and the to-be-formed metal circuit structure 400 (as shown in FIG. 1E).

Referring to FIG. 1D, in some embodiments, the protective structure 300 includes the nitride layer 304, the conformal layer 305, and the filling layer 306 filled in the recess R1. The conformal layer 305 is formed between the nitride layer 304 and the filling layer 306. The protective structure 300 illustrated in FIG. 1D is a triple layer structure, however, the embodiments of the present invention are not limited thereto. In other embodiments, the protective structure 300 may include a single layer structure, a bilayer structure, or a multilayer (i.e., more than three layer) structure. For example, the protective structure 300 may be made of only the conformal layer 305, or only the nitride layer 304 and the conformal layer 305, or only the conformal layer 305 and the filling layer 306. After performing the planarization process, a top surface 300t of the protective structure 300, the back side 200b of the second die 200, the top surfaces 205s of the TSVs 205, the top surface 226t of the dielectric layer 226, and a top surface 310t of the TDV 310 are substantially coplanar. Although only one TDV 310 is illustrated in FIG. 1D, more than one TDVs 310 may be formed.

Referring to FIG. 1E, a metal circuit structure 400 is formed over the back side 200b of the second die 200 in a back-end-of-line (BEOL) process. After the metal circuit structure 400 is formed, the 3DIC structure 1 is formed. In detail, a dielectric layer 402 are formed over the back side 200b of the second die 200 and the top surface 226t of the dielectric layer 226. A metal feature 404 is formed in the dielectric layer 402 by a patterning process and a suitable deposition process, such as a plating process. The metal feature 404 is formed to electrically connect to the TDV 310 and the TSV 205a uncovered by the protective structure 300. In some embodiments, the dielectric layer 402 includes silicon oxide, silicon oxynitride, silicon nitride, low dielectric constant (low-k) materials or a combination thereof. In some alternatively embodiments, the dielectric layer 402 may be a single layer or multiple layers. In some embodiments, the metal feature 404 includes plugs and metal lines. The plugs are formed between and in connection with two metal lines. The metal feature 404 may be made of tungsten (W), copper (Cu), copper alloys, aluminum (Al), aluminum alloys, or a combination thereof.

After the metal feature 404 is formed, a passivation layer 406 is formed to cover the dielectric layer 402 and expose a portion of the metal feature 404. In some embodiments, the passivation layer 406 includes silicon oxide, silicon nitride, benzocyclobutene (BCB) polymer, polyimide (PI), polybenzoxazole (PBO) or a combination thereof and is formed by a suitable process such as spin coating, CVD or the like. A bonding pad 408 is formed over the passivation layer 408 and extends to cover the metal feature 404. A material of the bonding pad 408 is different from the material of the first metal feature 404. In some embodiments, the material of the bonding pad 408 is softer than the material of the first metal features 404. In some embodiments, the bonding pad 408 includes a metal material, such as aluminum, copper, nickel, gold, silver, tungsten, or a combination thereof. The bonding pad 408 may be formed by depositing a metal material layer through a suitable process such as electro-chemical plating process, CVD, atomic layer deposition (ALD), PVD or the like, and then patterning the metal material layer.

It should be noted that the protective structure 300 filled in the recess R1 is disposed between the TSV 205b of the second die 200 and the metal feature 404 of the metal circuit structure 400, so as to separate or electrically isolate the TSV 205b of the second die 200 from the metal feature 404 of the metal circuit structure 400. As shown in FIG. 1E, the protective structure 300 completely covers the TSV 205b of the second die 200, thus, the TSV 205b having sharp morphology does not induce the plasma etching arcing during the patterning process of the metal circuit structure 400. That is, the reliability and the yield of the 3DIC structure 1 is enhanced accordingly. On the other hands, although the TSV 205b is electrically isolated from the metal circuit structure 400, the signal of the second device layer 203 below the TSV 205b is able to transfer to the metal circuit structure 400 by other TSVs (e.g., TSV 205a). Although only two TSVs 205a and 205b are illustrated in FIG. 1E, more than two TSVs 205a and 205b may be formed. That is, more than one TSV 205b is completely covered by more than one protective structure 300.

Figure 2:
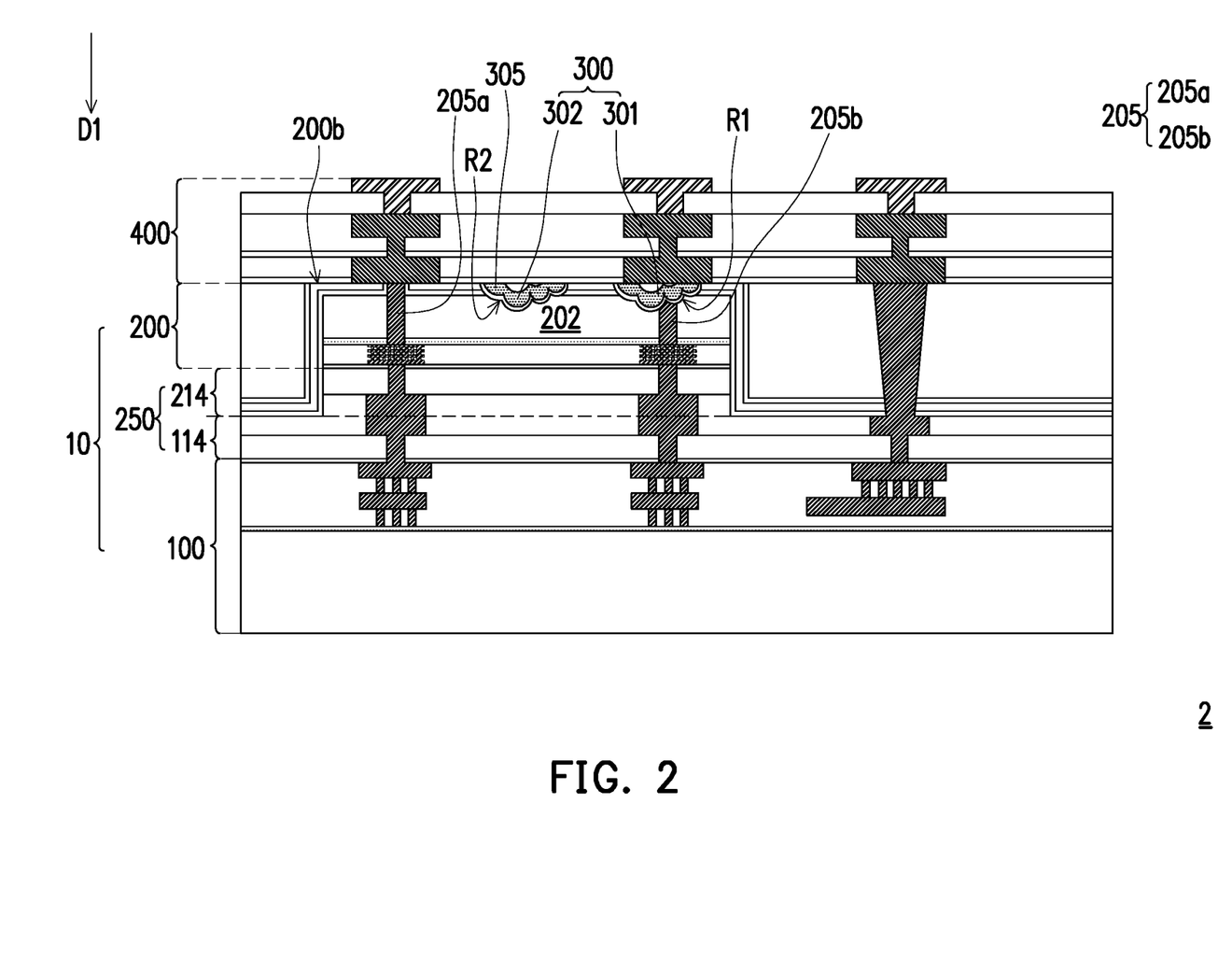
FIG. 2 is a cross-sectional view of a 3DIC structure in accordance with a second embodiment.

FIG. 2 is a cross-sectional view of a 3DIC structure in accordance with a second embodiment.

Referring to FIG. 2, a 3DIC structure 2 of the second embodiment is similar to the 3DIC structure 1 of the first embodiment illustrated in FIG. 1E. A difference therebetween lies in that the number of the protective structure 300 of the 3DIC structure 2 is plural. The protective structure 300 includes the protective structures 301 and 302. As shown in FIG. 2, the protective structures 301 and 302 are formed over the second semiconductor substrate 202 and both extend along a direction D1 from the back side 200b of the second die 200 toward the hybrid bonding structure 250. The protective structure 301 covers the TSV 205b of the second die 200, while the protective structure 302 does not cover any TSVs 205 (including TSVs 205a and 205b) of the second die 200. Specifically, the recess R2 resulted from the planarization process or the thinning process may be formed in a region without forming any TSVs 205. The conformal layer 305 is deposited in both the recess R1 and R2 to form the protective structures 301 and 302 simultaneously. Although only two protective structures 301 and 302 are illustrated in FIG. 1E, more than two protective structures 301 and 302 may be formed.

Figure 3:
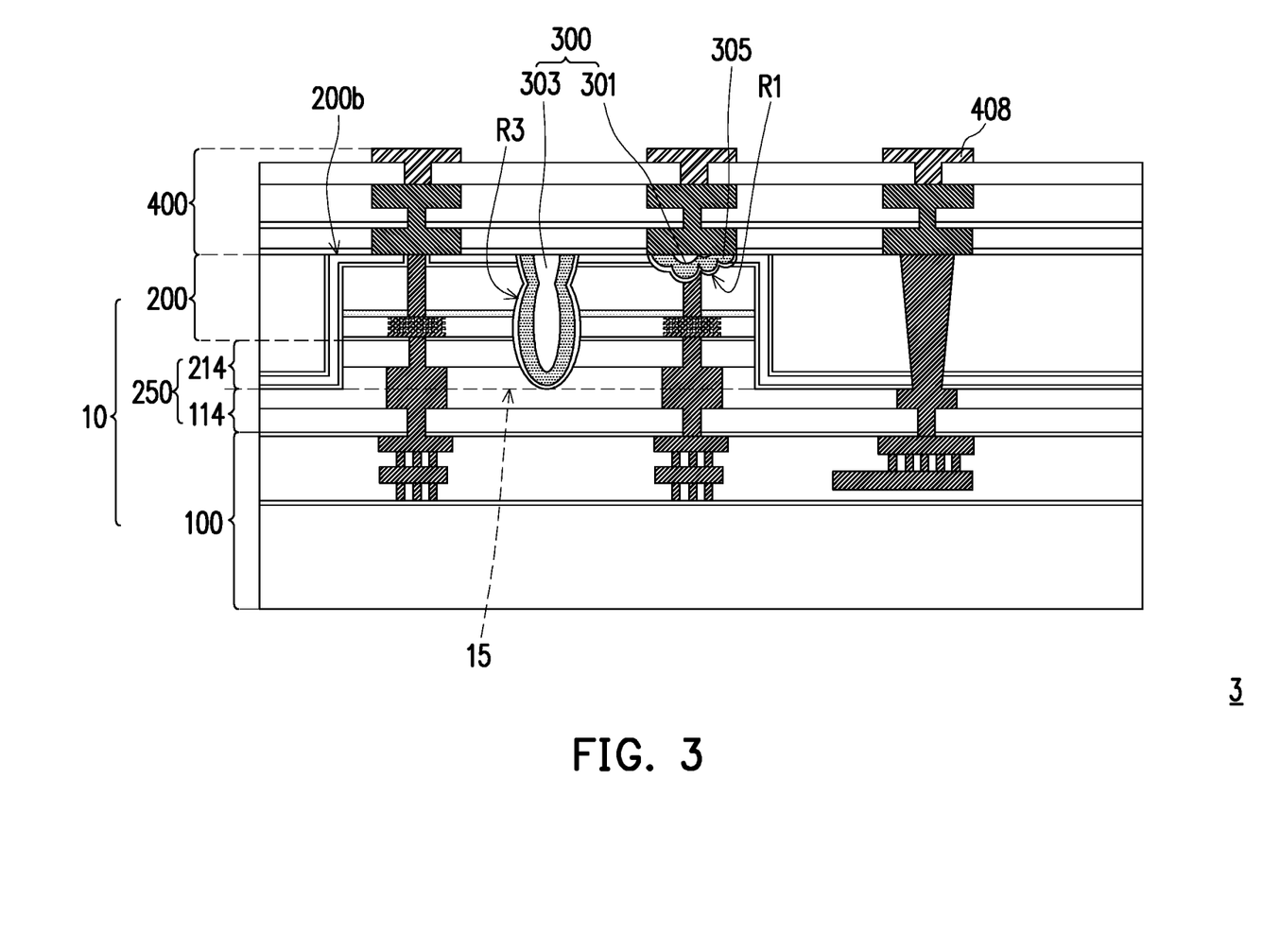
FIG. 3 is a cross-sectional view of a 3DIC structure in accordance with a third embodiment.

FIG. 3 is a cross-sectional view of a 3DIC structure in accordance with a third embodiment.

Referring to FIG. 3, a 3DIC structure 3 of the third embodiment is similar to the 3DIC structure 1 of the first embodiment illustrated in FIG. 1E. A difference therebetween lies in that the 3DIC structure 3 includes a protective structure 303 that extends from the back side 200b of the second die 200 into the hybrid bonding structure 250. A recess R3 is formed after performing the planarization process or the thinning process. The recess R3 is deep and has sharp morphology, the conformal layer 305 is able to completely cover the uneven and sharp surface of the recesses R3 and R1 to prevent from the plasma etching arcing during the patterning process of the metal circuit structure 400. In some embodiments, the protective structure 303 extends from the back side 200b of the second die 200 to the interface 15 between first bonding structure 114 of the first die 100 and the second bonding structure 214 of the second die 200

Figure 4:
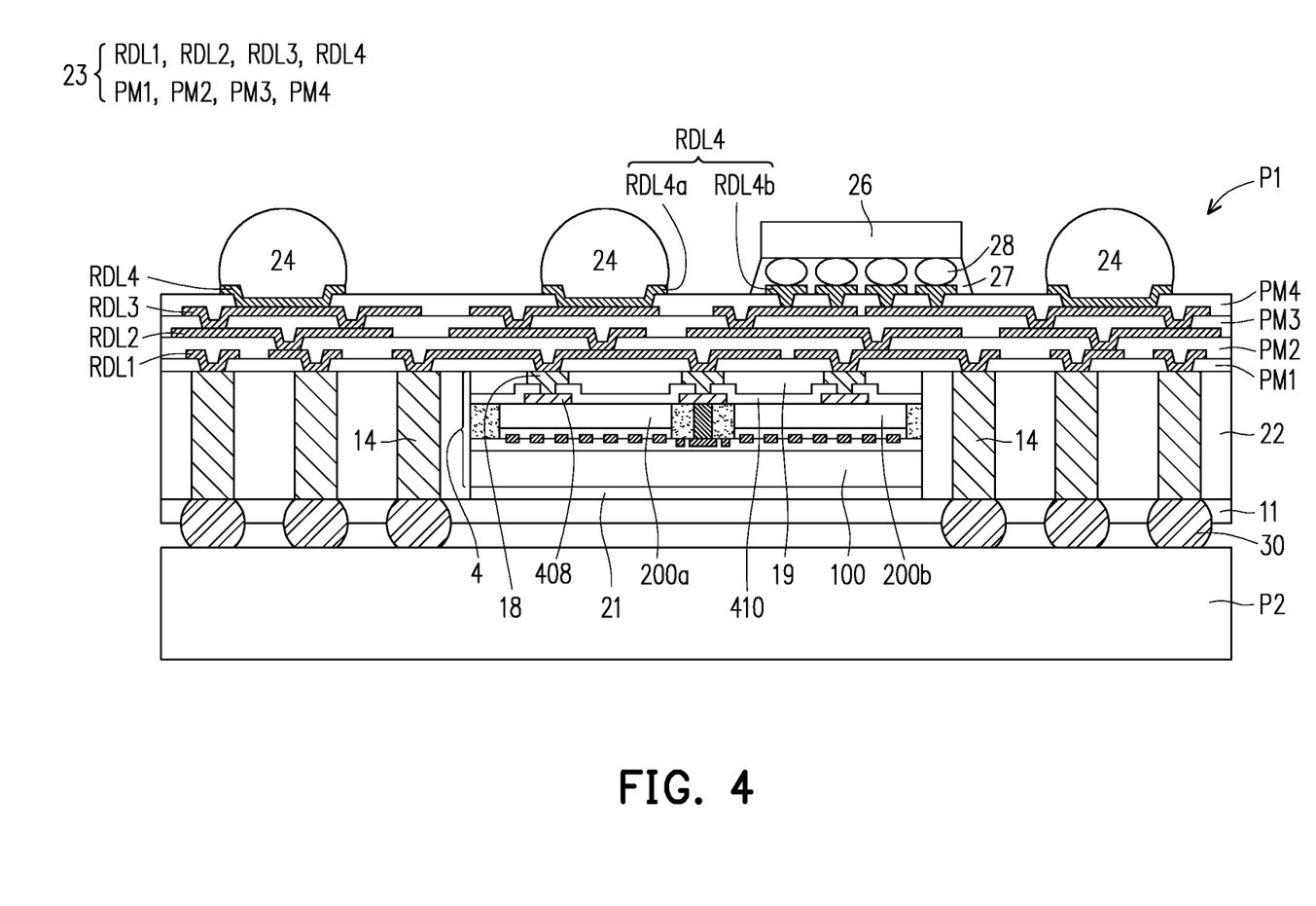
FIG. 4 is a cross-sectional view of a package in accordance with some embodiments.

FIG. 4 is a cross-sectional view of a package in accordance with some embodiments.

Referring to FIG. 4, a 3DIC structure 4 is mounted over a dielectric layer 11 by an adhesive layer 21. In some embodiments, the 3DIC structure 4 may be one of the foregoing 3DIC structure 1, 2, and 3. The 3DIC structure 4 includes a plurality of second dies 200a and 200b arranged in parallel over the first die 100. The second dies 200a and 200b and the first die 100 are face-to-face bonded together. The number of the second dies 200a and 200b is not limited in this disclosure.

In the embodiment, the 3DIC structure 4 further includes a plurality of connectors 18 and a passivation layer 19. The connectors 18 are formed over and electrically connected to the bonding pads 408 not covered by the passivation layer 410. Other components below the bonding pads 408, such as the dielectric layer 402 and the metal feature 404 shown in FIG. 1E, are not illustrated in FIG. 4 for clarity. The connector 18 includes solder bumps, gold bumps, copper bumps, copper posts, copper pillars, or the like. The passivation layer 19 is formed over the passivation layer 410 and aside the connectors 18 to cover the sidewalls of the connectors 18.

Referring to FIG. 4, an insulating encapsulation 22 is formed aside the 3DIC structure 4 to encapsulate the 3DIC structure 4. A plurality of conductive posts 14 are formed in the insulating encapsulation 22 and surround the 3DIC structure 4. A redistribution layer (RDL) structure 23 is formed over and electrically connected to the 3DIC structure 4 and the conductive posts 14. In some embodiments, the RDL structure 23 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

In other words, the redistribution layer RDL1 penetrates through the polymer layer PM1 and is electrically connected to the connectors 18 of the 3DIC structure 4 and the conductive posts 14. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers RDL1, RDL2, RDL3 and RDL4 includes conductive materials. The conductive materials include metal such as copper, nickel, titanium, a combination thereof or the like, and are formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers RDL1, RDL1, RDL3 and RDL4 respectively includes a plurality of vias and a plurality of traces connected to each other. The vias connects the traces, and the traces are respectively located on the polymer layers PM1, PM2, PM3 and PM 4, and are respectively extending on the top surface of the polymer layers PM1, PM2, PM3 and PM4.

In some embodiments, the topmost redistribution layer RDL4 includes RDL4a and RDL4b. The redistribution layer RDL4a is also referred as under-ball metallurgy (UBM) layer for ball mounting. The redistribution layer RDL4b may be micro bump for connecting to an integrated passive device (IPD) 26 formed in the subsequent process.

Thereafter, a plurality of connectors 24 are formed over and electrically connected to the redistribution layer RDL4a of the redistribution layer structure 23. In some embodiments, the connectors 24 are made of a conductive material with low resistivity, such as Sn, Pb, Ag, Cu, Ni, Bi or an alloy thereof, and are formed by a suitable process such as evaporation, plating, ball drop, or screen printing. An IPD 26 is formed over and electrically connected to the redistribution layer RDL4b of the redistribution layer structure 23 through the solder bumps 28. The IPD 26 may be a capacitor, a resistor, an inductor or the like, or a combination thereof. The number of the IPD 26 is not limited to that is shown in FIG. 4, but may be adjusted according to the design of the product. An underfill layer 27 is formed between the IPD 26 and the polymer layer PM4, and surrounds and covers the exposed RDL4b, the solder bumps 28 and the bottom surface of the IPD 26.

As shown in FIG. 4, the dielectric layer 11 is then patterned such that bottom surfaces of the conductive posts 14 is exposed by the dielectric layer 11. After the conductive terminals 30 are formed over the bottom surfaces of the conductive posts 14 respectively, an integrated fan-out package P1 having dual-side terminals is accomplished. Another package P2 is then provided. In some embodiments, the package P2 is, for example, a memory device. The package P2 is stacked over and is electrically connected to the integrated fan-out package P1 through the conductive terminals 30 such that a package-on-package (POP) structure is fabricated.

According to some embodiments, a three-dimensional integrated circuit (3DIC) structure includes a die stack structure, a metal circuit structure, and a protective structure. The die stack structure includes a first die and a second die bonded together. The second die has a plurality of through-substrate vias (TSVs). The metal circuit structure is disposed over a back side of the second die. The protective structure is sandwiched between and in contact with a bottom surface of the metal circuit structure and a top surface of one of the plurality of TSVs of the second die.

According to some embodiments, a method of manufacturing a 3DIC structure includes the following steps. A die stack structure including a first die and a second die face-to-face bonded together is formed. A first planarization process is performed to expose a plurality of through-substrate vias (TSVs) of the second die at a back side of the second die. The second die has a recess that extends into one of the plurality of TSVs of the second die. A protective material is filled in the recess. A second planarization process is performed to expose another of the plurality of TSVs of the second die and form a protective structure in the first recess. A top surface of the protective structure and a top surface of the another of the plurality of TSVs are substantially coplanar.

According to some embodiments, a 3DIC structure includes a die stack structure, a metal circuit structure, and an electrical isolating structure. The die stack structure includes a first die and a second die bonded together. The second die has a plurality of through-substrate vias (TSVs). The metal circuit structure is disposed over a top surface of the second die. The electrical isolating structure is embedded within the top surface of the second die and electrically isolating one of the plurality of TSVs of the second die from the metal circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated circuit (3DIC) structure, comprising:
 a die stack structure comprising a first die and a second die bonded together, the second die having a plurality of through-substrate vias (TSVs);
 a metal circuit structure disposed over a back side of the second die; and
 a first protective structure sandwiched between and in contact with a bottom surface of the metal circuit structure and a top surface of one of the plurality of TSVs of the second die, wherein the first protective structure is embedded within the back side of the second die, and separates and electrically isolates the one of the plurality of TSVs of the second die from the metal circuit structure.

2. The 3DIC structure of claim 1, wherein another of the plurality of TSVs is electrically connected to the metal circuit structure, and the top surface of the one of the plurality of TSVs of the second die is lower than a top surface of the another of the plurality of TSVs of the second die.

3. The 3DIC structure of claim 1, wherein the first protective structure comprises a conformal layer.

4. The 3DIC structure of claim 1, wherein the first protective structure comprises a composite structure comprising a conformal layer and a filling layer disposed over the conformal layer, and the conformal layer and the filling layer have different materials.

5. The 3DIC structure of claim 1, wherein the die stack structure further comprises:
 a first bonding stricture disposed over a front side of the first die; and
 a second bonding structure disposed over a front side of the second die, wherein the first bonding structure and the second bonding structure are hybrid bonded together by a metal-to-metal bonding and a non-metal-to-non-metal bonding.

6. The 3DIC structure of claim 5, further comprising a second protective structure embedded within the back side of the second die, wherein the first protective structure is in physical contact with the top surface of the one of the plurality of TSVs and the second protective structure is between the plurality of TSVs.

7. The 3DIC structure of claim 6, wherein the second protective structure extends from the back side of the second die into the second bonding structure, and the second protective structure has a height greater than the first protective structure thereof.

8. The 3DIC structure of claim 1, wherein a top surface of the first protective structure and the back side of the second die are substantially coplanar.

9. The 3DIC structure of claim 1, further comprising:
a dielectric layer, laterally encapsulating the second die; and
a through-dielectric via (TDV), disposed in the dielectric layer and electrically connected to the first die and the metal circuit structure.

10. A method of manufacturing a 3DIC structure, comprising:
forming a die stack structure comprising a first die and a second die face-to-face bonded together;
performing a first planarization process to expose a plurality of through-substrate vias (TSVs) of the second die at a back side of the second die, wherein the back side of the second die has a first recess that extends into one of the plurality of TSVs of the second die;
filling a protective material in the first recess; and
performing a second planarization process to expose another of the plurality of TSVs of the second die and form a protective structure in the first recess, wherein a top surface of the protective structure and a top surface of the another of the plurality of TSVs are substantially coplanar.

11. The method of claim 10, wherein the filling the protective material in the first recess comprises:
performing an atomic layer deposition (ALD) process to form a conformal layer over the back side of the second die, wherein the conformal layer completely covers a surface of the first recess; and
performing a chemical vapor deposition (CVD) process to forming a filling layer over the conformal layer.

12. The method of claim 10, further comprising forming a metal circuit structure over the back side of the second die and the top surface of the protective structure, so as to electrically connected to the die stack structure through the another of the plurality of TSVs, wherein the protective structure electrically isolates the one of the plurality of TSVs of the second die from the metal circuit structure.

13. The method of claim 10, wherein the forming the die stack structure comprises:
providing the first die and the second die;
forming a first bonding structure over a front side of the first die;
forming a second bonding structure over a front side of the second die; and
hybrid bonding the first bonding structure and the second bonding structure together by a metal-to-metal bonding and a non-metal-to-non-metal bonding, so as to form a hybrid bonding structure between the front side of the first die and the front side of the second die.

14. The method of claim 13, wherein the back side of the second die has a second recess after performing the first planarization process, the first and second recesses extend along a direction from the back side of the second die toward the hybrid bonding structure, and the second recess is between the plurality of TSVs of the second die.

15. The method of claim 14, wherein the second recess has a depth greater than the first recess thereof.

16. The method of claim 10, wherein a top surface of the one of the plurality of TSVs of the second die is lower than the top surface of the another of the plurality of TSVs of the second die after performing the second planarization process.

17. A 3DIC structure, comprising:
a die stack structure comprising a first die and a second die bonded together, the second die having a plurality of through-substrate vias (TSVs);
a metal circuit structure disposed over a top surface of the second die; and
an electrical isolating structure embedded within the top surface of the second die and electrically isolating one of the plurality of TSVs of the second die from the metal circuit structure.

18. The 3DIC structure of claim 17, further comprising:
a dielectric layer, laterally encapsulating the second die; and
a through-dielectric via (TDV), disposed in the dielectric layer and electrically connected to the first die and the metal circuit structure.

19. The 3DIC structure of claim 18, wherein a top surface of the dielectric layer, a top surface of TDV, a top surface of the electrical isolating structure, and the top surface of the second die are substantially coplanar.

20. The 3DIC structure of claim 17, wherein the electrical isolating structure comprises a composite structure comprising a conformal layer and a filling layer disposed over the conformal layer, and the conformal layer and the filling layer have different materials.

* * * * *